United States Patent
Handlogten et al.

(10) Patent No.: US 6,684,232 B1
(45) Date of Patent: Jan. 27, 2004

(54) METHOD AND PREDICTOR FOR STREAMLINING EXECUTION OF CONVERT-TO-INTEGER OPERATIONS

(75) Inventors: Glen Howard Handlogten, Rochester, MN (US); James Edward Phillips, Round Rock, TX (US); Lawrence Joseph Powell, Round Rock, TX (US); Martin Stanley Schmookler, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 418 days.

(21) Appl. No.: 09/696,911

(22) Filed: Oct. 26, 2000

(51) Int. Cl.[7] .................................................. G06F 5/00
(52) U.S. Cl. ........................................ 708/204; 708/497
(58) Field of Search ................................ 708/204, 497, 708/551

(56) References Cited

U.S. PATENT DOCUMENTS

| | | | | |
|---|---|---|---|---|
| 4,926,370 A | * | 5/1990 | Brown et al. | 708/497 |
| 6,131,104 A | * | 10/2000 | Oberman | 708/204 |
| 6,148,316 A | * | 11/2000 | Herbert et al. | 708/505 |
| 6,195,672 B1 | * | 2/2001 | Gouger et al. | 708/204 |
| 6,205,461 B1 | * | 3/2001 | Mansingh | 708/497 |

* cited by examiner

*Primary Examiner*—David H. Malzahn
(74) *Attorney, Agent, or Firm*—Casimer K. Salys; Bracewell & Patterson, L.L.P.

(57) ABSTRACT

During execution of floating point convert to integer instructions, the necessity for incrementing the instruction result during rounding is predicted early and utilized to predict the result sign, to produce an implied bit which will achieve the correct result with round determination logic for standard floating point instructions, and to set up rounding mode, guard and sticky bits allowing the standard round determination logic to be utilized during rounding of the floating point convert to integer instruction result. The minimum logic required to control incrementing of a standard floating point instruction result during rounding may therefore be reused for floating point convert to integer instructions without increasing the critical path for rounding and without significantly adding to the complexity of the floating point execution unit.

20 Claims, 4 Drawing Sheets

METHOD AND PREDICTOR FOR STREAMLINING EXECUTION OF CONVERT-TO-INTEGER OPERATIONS

BACKGROUND OF THE INVENTION

1. Technical Field

The present invention generally relates to processor design and in particular to computation units employing floating point operands within a processor. Still more particularly, the present invention relates to floating point convert to integer operations within a processor.

2. Description of the Related Art

Number conversion from fixed point format to floating point format and vice versa occurs with sufficient frequency within processors to justify inclusion of conversion instructions within an instruction set architecture (ISA). For example, floating point convert to integer (fcti) instructions are supported in the instruction set architecture of the PowerPC family of processors.

When precision is lost during conversion of a floating point number to a fixed point number, the result of the conversion is rounded under the influence of the current rounding mode. In most floating point designs, the determination of whether to increment the result of a floating point operation due to rounding (followed by storing the result into a register file) is a persistent critical path. This determination of whether to increment the result due to rounding must necessarily occur near the end of execution of a floating point operation. Including support for rounding of floating point convert to integer results within the rounding mechanism for floating point operation results (to allow reuse of that mechanism in floating point convert to integer operations) further impacts this already critical path since floating point convert to integer operations present different computational requirements than floating point operations.

The impact on the critical path may be alleviated by adding a processor cycle to the execution latency, but not without degrading performance. It would be desirable, therefore, to provide a computational system for rounding the result of floating point convert to integer operations utilizing only the minimum logic required for execution of standard floating point operations without significantly degrading performance.

SUMMARY OF THE INVENTION

It is therefore one object of the present invention to provide an improved processor design.

It is another object of the present invention to provide an improved design for computation units employing floating point operands within a processor.

It is yet another object of the present invention to provide improving performance of floating point convert to integer operations within a processor.

The foregoing objects are achieved as is now described. During execution of floating point convert to integer instructions, the necessity for incrementing the instruction result during rounding is predicted early and utilized to predict the result sign, to produce an implied bit which will achieve the correct result with round determination logic for standard floating point instructions, and to set up rounding mode, guard and sticky bits allowing the standard round determination logic to be utilized during rounding of the floating point convert to integer instruction result. The minimum logic required to control incrementing of a standard floating point instruction result during rounding may therefore be reused for floating point convert to integer instructions without increasing the critical path for rounding and without significantly adding to the complexity of the floating point execution unit.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
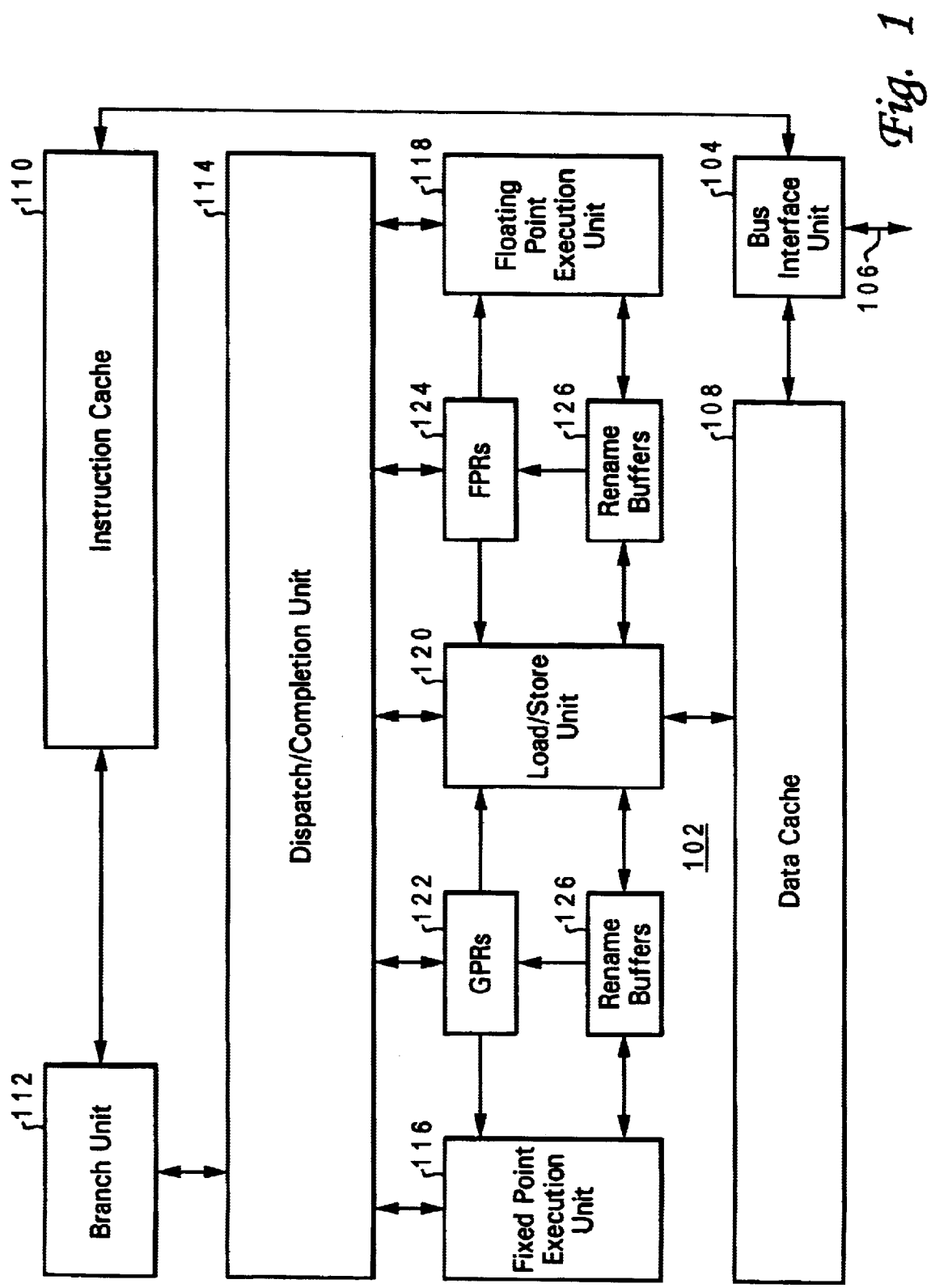
FIG. 1 depicts a high-level block diagram of a processor in which a preferred embodiment of the present invention is implemented.

With reference now to the figures, and in particular with reference to FIG. 1, a high-level block diagram of a processor in which a preferred embodiment of the present invention is implemented is depicted. Processor 102 in the depicted example is a superscalar processor containing multiple execution units in accordance with the known art. Accordingly, processor 102 includes a bus interface unit ("BIU") 104 which enables the flow of data and instructions between the processor 102 and the remainder of a data processing system (not shown) via a bus connection 106. Data retrieved by processor 102 from the remainder of the data processing system (e.g., from main memory) is stored within a (level 1 or "L1") data cache 108 within processor 102, while instructions similarly retrieved by processor 102 are stored within instruction cache 110.

Instruction to be executed within processor 102 are retrieved from the instruction cache 110 by branch unit 112 and sent to dispatch/completion unit 114. Instructions are dispatched by dispatch/completion unit 114 to the appropriate execution unit depending upon the instruction type: fixed point or integer instructions are dispatched to fixed point execution unit 116; floating point instructions are dispatched to floating point execution unit 118; and LOAD and STORE instructions are dispatched to load/store unit 120.

Operands for both fixed point and floating point instructions are retrieved from data cache 108 by load/store unit 120 and stored in either general purpose registers (GRPs) 122 or floating point registers (FPRs) 124 via rename buffers 126. Similarly, results from executed instructions are written by fixed point execution unit 116 into general purpose registers 122 and by floating point execution unit 118 into floating point registers 124 via rename buffers 126. Instruction results for completed instructions are written back to data cache 108 by load/store unit 120, and eventually are written back to main memory.

Processor 102 may contain other execution units and more complex functionality than that depicted in FIG. 1. The exemplary embodiment of FIG. 1, however, includes logic supporting execution of floating point convert to integer instructions previously described within floating point execution unit 118. In particular, floating point execution unit 118 reuses rounding and normalizing logic for floating point operations in rounding the results of floating point convert to integer instructions by early prediction of whether the result will require incrementing and the sign of the result, as described in further detail below.

Figure 2A:
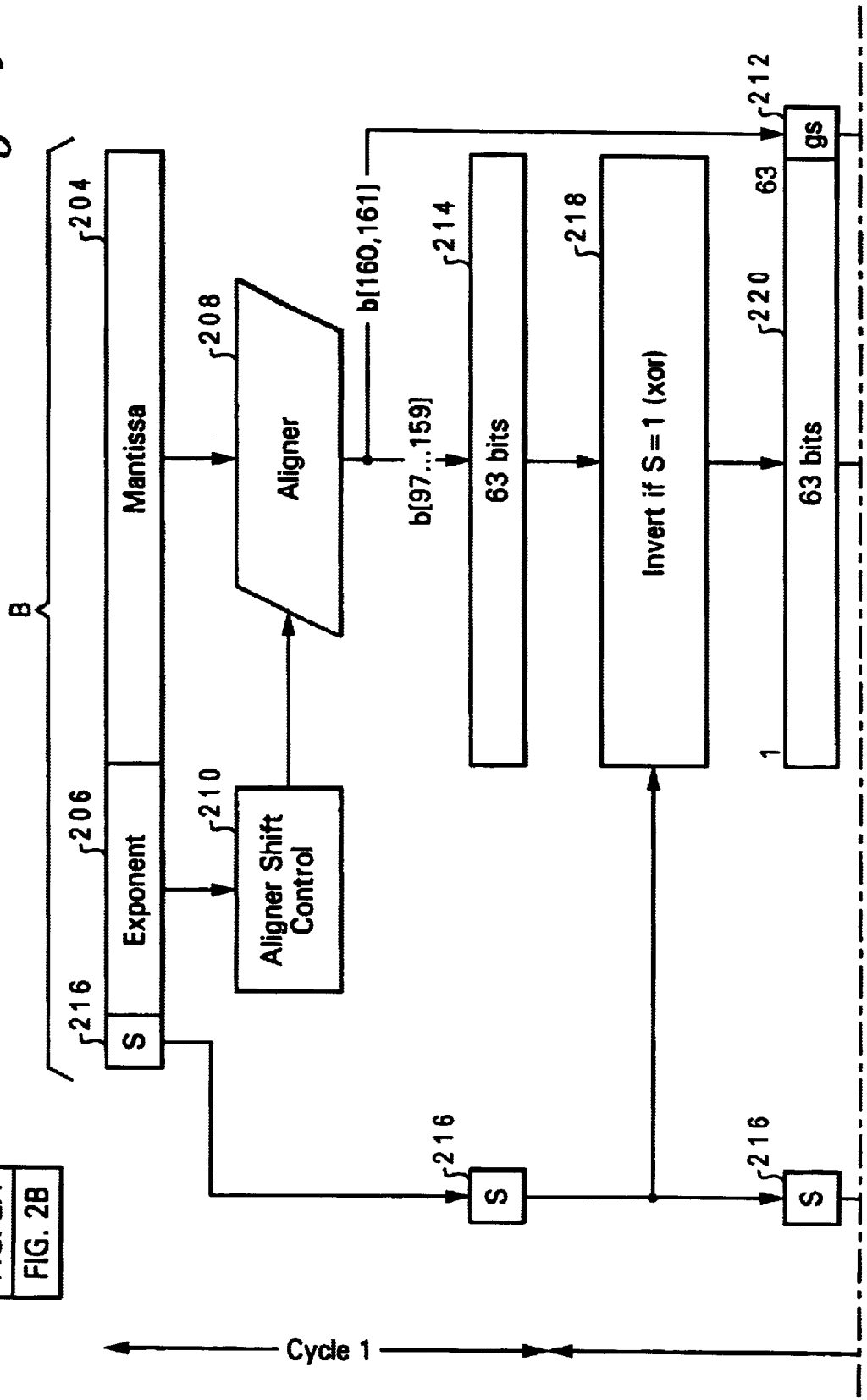
FIGS. 2A and 2B are diagrams of a mechanism for predicting whether a result will be incremented during rounding and the sign of the result in accordance with a preferred embodiment of the present invention.
Figure 2B:
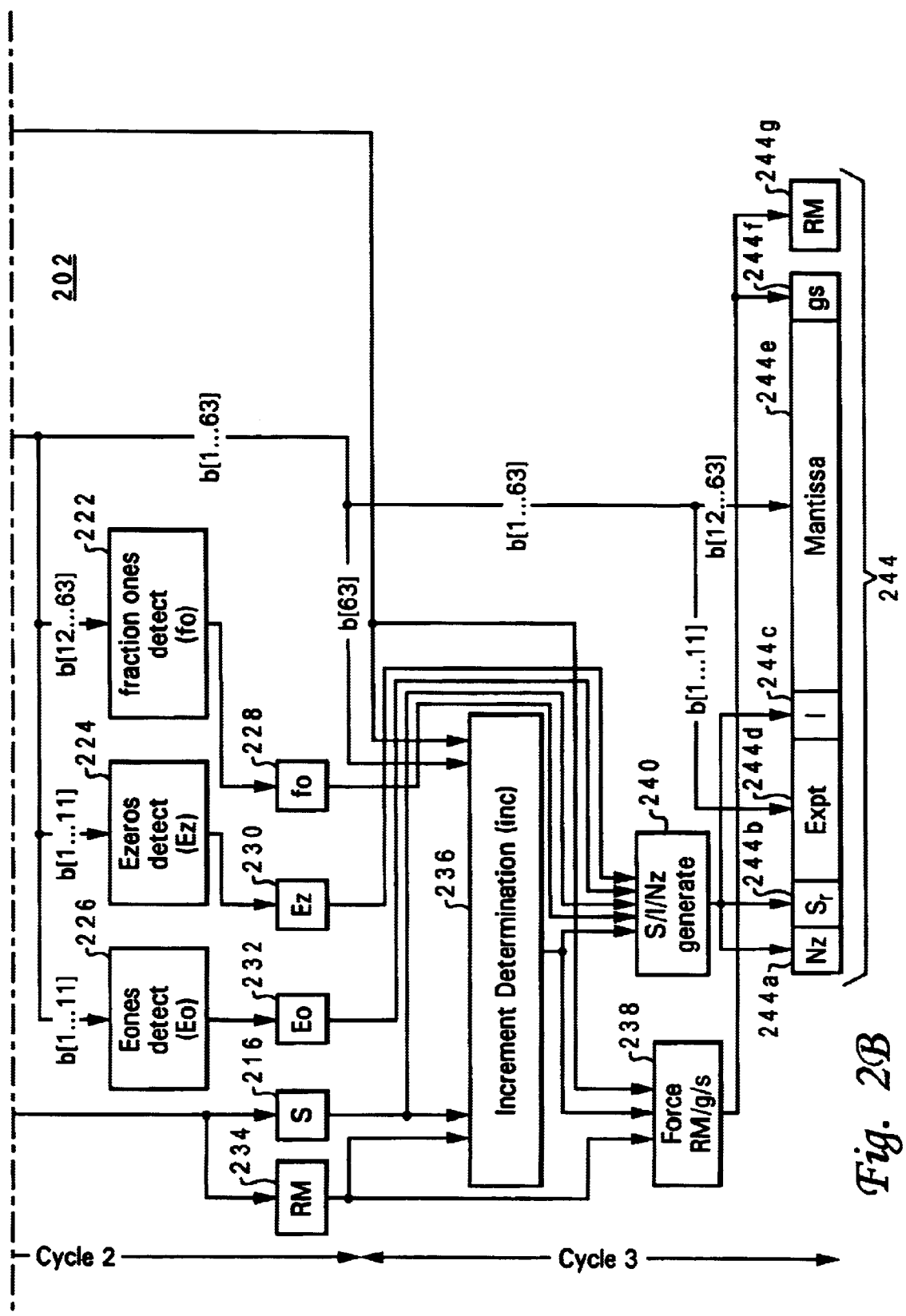

Referring to FIG. 2, a diagram of a mechanism for predicting whether a result will be incremented during rounding and the sign of the result in accordance with a preferred embodiment of the present invention is illustrated. The floating point convert to integer rounding logic 202 is implemented within the floating point execution unit 118 depicted in FIG. 1.

The exemplary embodiment of floating point convert to integer rounding logic 202 is implemented within a processor employing fused multiply-add (e.g., (A*C)+B for operands A, B and C) logic for performing mathematical operations. For floating point convert to integer instructions, the operand for the instruction is the B operand ("B" or "bop"), which is in floating point format.

For floating point convert to integer operations, the mantissa 204 of the operand B is first aligned to the right of the dataflow, such that the bit position b[159] of the aligned operand is $2^0$. The exponent 206 of operand B is utilized to determine the alignment shift amount required to achieve such alignment, and the shift is performed by aligner 208, which receives mantissa 204 as an input, under the control of aligner shift control 210, which receives exponent 206 as an input. Mantissa bits shifted off the right of the shifted operand are accumulated in the guard and sticky bits 212 (denoted "g" and "s" respectively) in bit positions b[160] (for guard bit g) and b[161] (for sticky bit s).

In the following processor cycle, the shifted operand mantissa 214 is conditionally inverted if the floating point format operand B is negative, as determined from the sign bit ("S") 216 of operand B. The inverter logic 218 performing the conditional inversion may comprise a set of parallel XOR gates. Prior to conditional inversion, the bits of the shifted operand mantissa 214 are latched and logically renumbered from bit one (b[1]), such that the bit position corresponding to bit b[159] of the original operand B becomes bit b[63]. After the conditional inversion, the bits are again latched.

The results 220 of the conditional inversion are latched and examined to determine: (1) whether all fraction bits (i.e., bits b[12 . . . 63]) are logical ones, (2) whether all exponent bits (i.e., bits b[1 . . . 11]) are logical zeros, and (3) whether all exponent bits are logical ones. These determinations are made by fraction ones detect logic 222, exponent zeros ("Ezeros") detect logic 224, and exponent ones ("Eones") detect logic 226, respectively. The results of these determinations are designated of 228, Ez 230, and Eo 232, respectively. The rounding mode ("RM") 234 is forced to round to positive infinity or negative infinity, depending upon the sign 216 of the original operand B, by:

RM=1S where S is the sign 216 of the original operand B.

Next, whether an increment will be required by rounding the converted operand is predicted by increment determination logic 236, which receives as inputs the results 220 of the conditional inversion of the shifted operand mantissa, the guard and sticky bits 212, of 228, Ez 230, Eo 232, sign 216 and rounding mode 234. Based on the rules of the IEEE Standard 754 for floating point rounding, determination of when to increment the integer portion of the operand is a function of the rounding mode RM, the operand sign S, the guard bit g, the sticky bit s, and the least significant bit L (bit b[63]).

For example, if the rounding mode specifies "round to nearest" and the sign is zero (the operand is a positive number), then an increment is performed during rounding when the guard bit g is one and either the least significant bit L or the sticky bit s is also one:

incr=g&(L|s); when RM=(round to nearest) and S=0.

Similar relations may be determined for the other rounding modes and for when the operand is negative, and truth tables may be employed to assist in determining these relations. When the operand is negative and both the guard bit g and the sticky bit s are zero, then an increment must be performed during rounding to obtain the "twos complement" of the original shifted operand. The conditional invert operation performed by inverter logic 218 provides the "ones complement," which may be incremented to produce the "twos complement." The full logical equation for determining whether to increment, using n, z, p, and m to represent the four rounding modes "round to nearest," "round to zero," "round to plus infinity," and "round to minus infinity," is:

incr=(!S&((n&g&(L|s))|(p&(g|s))))|(S&((n&(!g|(L&!s))|(m&!g&!s)|p|z))

where "!x" represents the inverse of the variable "x," "&" represents a logical AND function, and "|" represents a logical OR function.

The results of increment determination logic 236, designated "inc", are then utilized to massage the rounding mode, the guard bit and the sticky bit in a manner allowing the standard rounding increment determination logic to be employed to produce the correct increment (rounding) control.

In the exemplary embodiment, for instance, if an increment is predicted (inc is asserted), then the guard and sticky bits are forced to 11, which will, in turn, force the standard increment detection logic within the floating point result rounding mechanism to assert the increment control. Alternatively, if an increment is not predicted, the guard and sticky bits are forced to 00, which will deassert the increment control from the standard increment logic as desired. Other techniques for manipulating the rounding mode, guard and sticky bits will be apparent to those skilled in the art. In the example shown, the manipulation of rounding mode, guard and sticky bits is performed by force RM/g/s logic 238, which receives as inputs rounding mode 234, the output inc of increment determination logic 236, and guard and sticky bits 212.

Also during the third processor cycle, a correct sign ("$S_r$"), an implied bit ("I") and a negative zero prediction result ("Nz") are determined by S/I/Nz generator 240, which receives as inputs the output inc of increment determination logic 236, sign 216, fraction ones result of 228, exponent zeros result Ez 230, and exponent ones result Eo 232.

The implied bit I which is generated by S/I/Nz generator 240 will be accurate after passing through the rounder for all cases except for negative zero conversion results. Negative zero conversion results may be handled as a special case utilizing mostly existing logic within the floating point execution unit as described below. For all cases other than negative zero, the implied bit is calculated from:

$$I=(!S\&(!Ez|(inc\&fo)))|(S\&(!Ez|fo)).$$

This implied bit I will be inserted between bits b[12] and b[13] of the intermediate result.

For the case in which the converted operand is a negative zero, the correct result may be obtained by forcing zero, assuming that negative zero results may be predicted. Since forcing zero is already required by other operations, such a scheme requires little additional logic. A negative zero result may be predicted by:

$$Nz=S\&Eo\&fo\&inc\&!OF$$

where "OF" represents an overflow condition. Since overflow conditions may be handled by spin logic, detection of the overflow condition is not required for a first pass determination of where a negative zero result will be obtained and therefore may be removed from the above expression to obtain:

$$Nz=S\&Eo\&fo\&inc,$$

avoiding the necessity of predicting an overflow condition. the negative zero result signal Nz is logically OR'd with existing calculation results within the floating point execution unit and employed to assert a multiplexer select signal in order to force a zero result.

A negative zero conversion result is also a unique case in that such a result is the only case in which the floating point convert to integer instruction must return an opposite sign for the final result. The above prediction for negative zero result Nz may therefore be employed to generate the correct sign for the conversion according to:

$$S_r=S\&!Nz=S\&!(S\&Eo\&fo\&inc)=S\&!(Eo\&fo\&inc)$$

where $S_r$ is the correct sign for the floating point convert to integer result.

Force RM/g/s logic 238, S/I/Nz generator 240, and inverter 220 thus produce an intermediate result 244 from the result 220 of the conditional inversion of the shifted operand mantissa. The intermediate result includes a negative zero prediction result Nz 244a, a correct result sign $S_r$ 244b, and an accurate implied bit I 244c produced by S/I/Nz generator 240. As noted above, implied bit I 244c is inserted between the exponent and mantissa of the intermediate result, between bits b[11] and b[12] of the dataflow. The dataflow (result 220) is split into a biased exponent (Expt) 244d, which comprises bits b[1 . . . 11] of the dataflow, and a mantissa 244e, which comprises bits b[12 . . . 63] of the dataflow. Guard and sticky bits 244f and a rounding mode indicator 244g received from force RM/g/s logic 238 complete intermediate result 244.

The calculations described above and illustrated by FIG. 2 are either substituted into appropriate positions of the dataflow at noncritical stages, or are added to the data piped with the instruction. Only three processor cycles are required to complete these calculations, which is less than or equal to the number of processor cycles required to perform floating point operations up to normalization and rounding.

Figure 3:
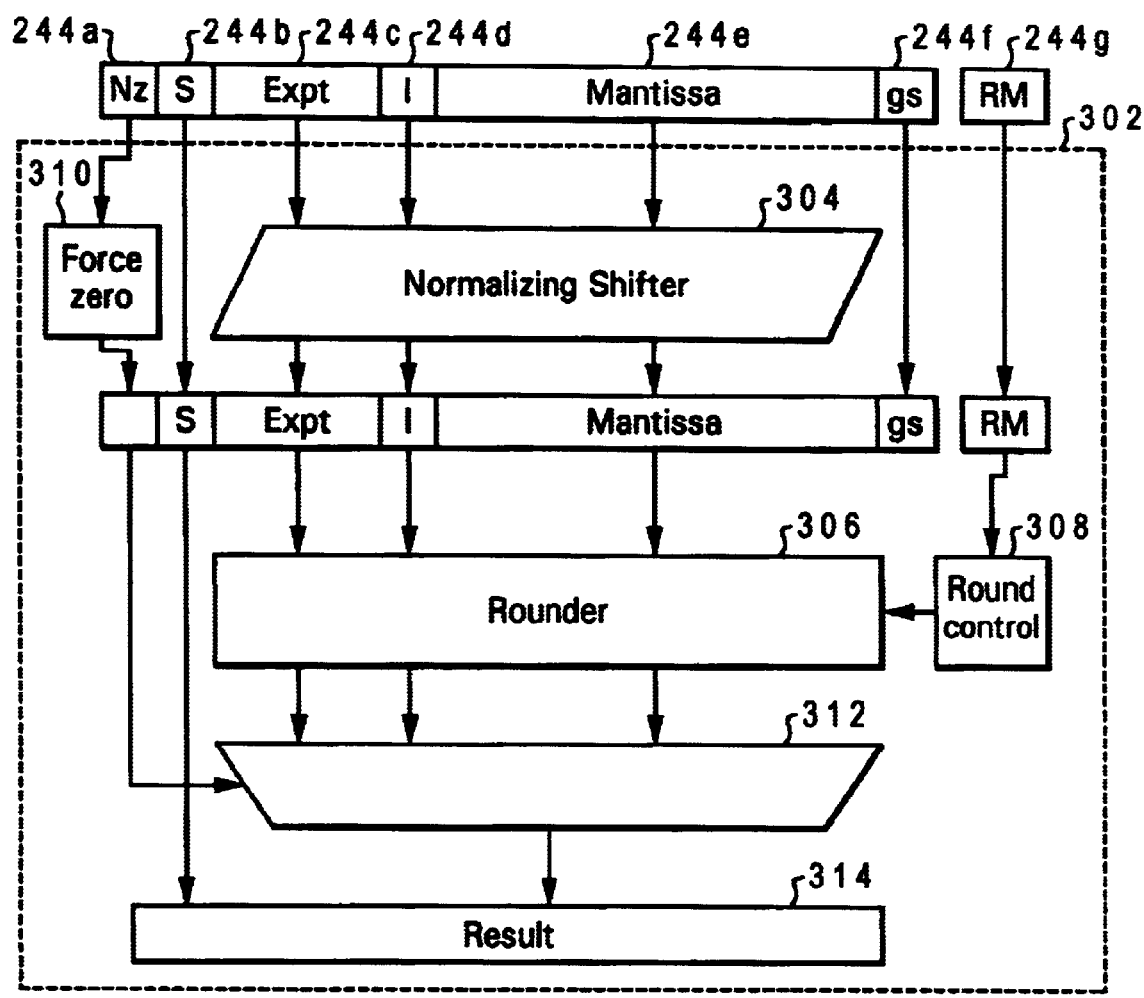
FIG. 3 depicts a diagram of an existing rounding mechanism for floating point operations utilized to round an intermediate result produced by predicting whether a result will be incremented during rounding and the sign of the result in accordance with a preferred embodiment of the present invention.

With reference now to FIG. 3, a diagram of an existing rounding mechanism for floating point operations utilized to round an intermediate result produced by predicting whether a result will be incremented during rounding and the sign of the result in accordance with a preferred embodiment of the present invention is depicted. Intermediate result 244 is employed with the existing rounding mechanism 302 of the floating point execution unit 118. The constituent components of intermediate result 244 are passed through or around normalization shifter 304 to the rounder 306 where the standard calculation for rounding produces the correct increment control. Sign 244b and guard and sticky bits 244f are passed around normalization shifter 304, while exponent 244c, implied bit 244d, and mantissa 244e may be passed through normalization shifter 304, which will not alter their values.

Rounder 306 operates under the control of round control logic 308, which receives round mode 244g as an input. For all cases in which the negative zero result Nz 244a is not asserted, the correct implied bit out of rounder 306 is obtained from a straight increment of the mantissa, if required, with the caveat that the increment at the implied bit position is sticky (i.e., if the implied bit is a logical "1" going into the incrementor within rounder 306, then the implied bit out of the incrementor is also a logical "1"). For negative zero cases, force zero control logic 310, which receives negative zero result Nz 244a as an input, causes special select multiplexer 312 at the output of rounder 306 to select a forced zero, logic which is already required for other floating point operations. The output of multiplexer 312 is the result of the floating point convert to integer instructions except for the sign, with is produced by passing through the correct sign $S_r$ 244b.

The present invention provides a mechanism allowing execution of floating point convert to integer instructions without impacting the decision regarding whether to increment the result or burdening the critical increment path. During execution of the floating point convert to integer instructions, the need to increment due to rounding is predicted early and utilized both to predict the result sign and to produce an implied bit which is fed into the increment mechanism in order to achieve the correct result with a nearly standard increment. The prediction regarding the need to increment during rounding is also employed to set up rounding mode, guard and sticky bits early in the execution, allowing the standard round determination logic to be utilized to control incrementing during rounding. As a result, the minimum logic required to control incrementing of a standard floating point instruction result may be reused for floating point convert to integer instructions.

While the invention has been particularly shown and described with reference to a preferred embodiment, it will be understood by those skilled in the art that various changes in form and detail may be made therein without departing from the spirit and scope of the invention.

What is claimed is:

1. A method of rounding a floating point convert to integer instruction result, comprising:

aligning an operand mantissa of an operand with a base integer bit position utilizing an operand exponent;

predicting, from the aligned operand mantissa and a sign of the operand, whether the floating point convert to integer instruction result will be incremented during rounding;

generating results of the prediction, the results including a plurality of control bits; and employing the results of the prediction to control a rounder in an existing floating point rounding mechanism to obtain a correctly rounded result for the floating point convert to integer instruction.

2. The method of claim 1, wherein the step of aligning an operand mantissa with a base integer bit position utilizing an operand exponent further comprises:

accumulating bits shifted off the aligned operand mantissa as guard and sticky bits.

3. The method of claim 1, wherein the step of predicting whether the floating point convert to integer instruction result will be incremented during rounding further comprises:

inverting the aligned operand mantissa only if an operand including the operand mantissa and the operand exponent is negative;

determining whether a fraction portion of the conditionally inverted aligned operand mantissa contains all ones and whether an exponent portion of the conditionally inverted aligned operand mantissa contains all ones or all zeroes; and determining whether the instruction result will be incremented during rounding from a sign of the operand mantissa, from whether the fraction portion of the conditionally inverted aligned operand mantissa contains all ones, and from whether the exponent portion of the conditionally inverted aligned operand mantissa contains all ones.

4. The method of claim 3, wherein the step of employing results of the prediction to control an existing rounding mechanism for other floating point instructions to obtain a correctly rounded result further comprises:

setting a rounding mode bit equal to a sign of the operand;

setting guard and sticky bits to logical ones if an increment of the instruction result during rounding is predicted; and setting guard and sticky bits to logical zeroes if an increment of the instruction result during rounding is not predicted.

5. The method of claim 3, wherein the step of employing results of the prediction to control an existing rounding mechanism for other floating point instructions to obtain a correctly rounded result further comprises:

generating an implied bit for the existing rounding mechanism by logically combining the prediction results with the sign of the operand, a bit indicating whether the fraction portion of the conditionally inverted aligned operand mantissa contains all ones, and a bit indicating whether the exponent portion of the conditionally inverted aligned operand mantissa contains all zeroes.

6. The method of claim 3, wherein the step of employing results of the prediction to control an existing rounding mechanism for other floating point instructions to obtain a correctly rounded result further comprises:

generating a negative zero bit for the existing rounding mechanism by logically combining the prediction results with the sign of the operand, a bit indicating whether the fraction portion of the conditionally inverted aligned operand mantissa contains all ones, and a bit indicating whether the exponent portion of the conditionally inverted aligned operand mantissa contains all ones.

7. The method of claim 6, wherein the step of employing results of the prediction to control an existing rounding mechanism for other floating point instructions to obtain a correctly rounded result further comprises:

generating a correct sign for the correctly rounded result by logically combining the sign of the operand with an inverse of the negative zero bit.

8. The method of claim 3, wherein the step of employing results of the prediction to control an existing rounding mechanism for other floating point instructions to obtain a correctly rounded result further comprises:

generating a biased operand exponent to be provided to the existing rounding mechanism by:

inverting a most significant bit within the exponent portion of the conditionally inverted aligned operand mantissa, and inserting the inverted most significant bit between the most significant bit and a next most significant bit within the exponent portion of the conditionally inverted aligned operand mantissa to form an expanded, biased operand exponent.

9. A mechanism for rounding a floating point convert to integer instruction result, comprising:

means for aligning an operand mantissa of an operand with a base integer bit position utilizing an operand exponent;

means for predicting, from the aligned operand mantissa and a sign of the operand, whether the floating point convert to integer instruction result will be incremented during rounding;

means for generating results of the prediction, the results including a plurality of control bits; and means for employing the results of the prediction to control a rounder in an existing floating point rounding mechanism to obtain a correctly rounded result for the floating point convert to integer instruction.

10. The mechanism of claim 9, wherein the means for aligning an operand mantissa with a base integer bit position utilizing an operand exponent further comprises:

means for accumulating bits shifted off the aligned operand mantissa as guard and sticky bits.

11. The mechanism of claim 9, wherein the means for predicting whether the floating point convert to integer instruction result will be incremented during rounding further comprises:

means for inverting the aligned operand mantissa only if an operand including the operand mantissa and the operand exponent is negative;

means for determining whether a fraction portion of the conditionally inverted aligned operand mantissa contains all ones and whether an exponent portion of the conditionally inverted aligned operand mantissa contains all ones or all zeroes; and means for determining whether the instruction result will be incremented during rounding from a sign of the operand mantissa, from whether the fraction portion of the conditionally inverted aligned operand mantissa contains all ones, and from whether the exponent portion of the conditionally inverted aligned operand mantissa contains all ones.

12. The mechanism of claim 11, wherein the means for employing results of the prediction to control an existing rounding mechanism for other floating point instructions to obtain a correctly rounded result further comprises:

means for setting a rounding mode bit equal to a sign of the operand;

means for setting guard and sticky bits to logical ones if an increment of the instruction result during rounding is predicted; and means for setting guard and sticky bits to logical zeroes if an increment of the instruction result during rounding is not predicted.

13. The mechanism of claim 11, wherein the means for employing results of the prediction to control an existing rounding mechanism for other floating point instructions to obtain a correctly rounded result further comprises:

means for generating an implied bit for the existing rounding mechanism by logically combining the prediction results with the sign of the operand, a bit indicating whether the fraction portion of the conditionally inverted aligned operand mantissa contains all ones, and a bit indicating whether the exponent portion of the conditionally inverted aligned operand mantissa contains all zeroes.

14. The mechanism of claim 11, wherein the means for employing results of the prediction to control an existing rounding mechanism for other floating point instructions to obtain a correctly rounded result further comprises:

means for generating a negative zero bit for the existing rounding mechanism by logically combining the prediction results with the sign of the operand, a bit indicating whether the fraction portion of the conditionally inverted aligned operand mantissa contains all ones, and a bit indicating whether the exponent portion of the conditionally inverted aligned operand mantissa contains all ones.

15. The mechanism of claim 14, wherein the means for employing results of the prediction to control an existing rounding mechanism for other floating point instructions to obtain a correctly rounded result further comprises:

means for generating a correct sign for the correctly rounded result by logically combining the sign of the operand with an inverse of the negative zero bit.

16. The mechanism of claim 11, wherein the means for employing results of the prediction to control an existing rounding mechanism for other floating point instructions to obtain a correctly rounded result further comprises:

means for generating a biased operand exponent to be provided to the existing rounding mechanism by
  inverting a most significant bit within the exponent portion of the conditionally inverted aligned operand mantissa, and
  inserting the inverted most significant bit between the most significant bit and a next most significant bit within the exponent portion of the conditionally inverted aligned operand mantissa to form an expanded, biased operand exponent.

17. A mechanism for processing a floating point convert to integer instruction to allow rounding by an existing rounding mechanism for other floating point instructions, comprising:

an aligner aligning an operand mantissa with a base integer bit position utilizing an operand exponent, wherein the aligner accumulates bits shifted off the aligned operand mantissa as guard and sticky bits;

an inverter inverting the aligned operand mantissa only if a sign for an operand including the operand mantissa and the operand exponent is negative;

a fraction ones detector determining whether a fraction portion of the conditionally inverted aligned operand mantissa contains all ones and generating a fraction ones bit indicating whether the fraction portion contains all ones;

an exponent ones detector determining whether an exponent portion of the conditionally inverted aligned operand mantissa contains all ones and generating an exponent ones bit indicating whether the exponent portion contains all ones;

an exponent zeroes detector determining whether the exponent portion of the conditionally inverted aligned operand mantissa contains all zeroes and generating an exponent ones bit indicating whether the exponent portion contains all zeroes; and an increment determination unit predicting whether a result for the floating point convert to integer instruction will be incremented during rounding from the sign of the operand mantissa, the guard and sticky bits, the fraction ones bit, the exponent ones bit, and the exponent zeroes bit.

18. The mechanism of claim 17, further comprising:

a rounding mode bit for the existing rounding mechanism, wherein the rounding mode bit equals the sign of the operand; and forced guard and sticky bits for the existing rounding mechanism, wherein the forced guard and sticky bits are logical ones if an increment of the instruction result during rounding is predicted by the increment determination unit and are logical zeroes if an increment of the instruction result during rounding is not predicted by the increment determination unit.

19. The mechanism of claim 17, further comprising:

an implied bit for the existing rounding mechanism, wherein the implied bit is generated by logically combining an output of the increment determination unit with the sign of the operand, the fraction ones bit, and the exponent zeroes bit.

20. The mechanism of claim 17, further comprising:

a negative zero bit for the existing rounding mechanism, wherein the negative zero bit is generated by logically combining by logically combining an output of the increment determination unit with the sign of the operand, the fraction ones bit and the exponent ones bit.

* * * * *